US008451454B2

(12) United States Patent
Koenen et al.

(10) Patent No.: US 8,451,454 B2
(45) Date of Patent: May 28, 2013

(54) STAGE SYSTEM, LITHOGRAPHIC APPARATUS INCLUDING SUCH STAGE SYSTEM, AND CORRECTION METHOD

(75) Inventors: Willem Herman Gertruda Anna Koenen, Roermond (NL); Emiel Jozef Melanie Eussen, Eindhoven (NL); Engelbertus Antonius Fransiscus Van Der Pasch, Oirschot (NL)

(73) Assignee: ASML Netherlands B.V., Veldhoven (NL)

( * ) Notice: Subject to any disclaimer, the term of this patent is extended or adjusted under 35 U.S.C. 154(b) by 532 days.

(21) Appl. No.: 12/268,659

(22) Filed: Nov. 11, 2008

(65) Prior Publication Data

US 2009/0128791 A1    May 21, 2009

Related U.S. Application Data

(60) Provisional application No. 60/996,505, filed on Nov. 20, 2007.

(51) Int. Cl.
| | |
|---|---|
| *G01B 11/14* | (2006.01) |
| *G03B 27/42* | (2006.01) |
| *G03B 27/58* | (2006.01) |
| *G03F 7/20* | (2006.01) |

(52) U.S. Cl.
CPC .................................. *G03F 7/70775* (2013.01)
USPC .................. 356/500; 355/53; 355/72; 355/77

(58) Field of Classification Search
CPC ............................ G03F 7/70775; G03F 7/70716
USPC .................. 355/53, 72, 75, 77; 356/499, 500
See application file for complete search history.

(56) References Cited

U.S. PATENT DOCUMENTS

| 5,610,715 A  * | 3/1997 | Yoshii et al. ..................... 356/499 |
| 6,819,425 B2 * | 11/2004 | Kwan ............................ 356/399 |

(Continued)

FOREIGN PATENT DOCUMENTS

| CN | 101055425 A | 10/2007 |
| KR | 10-2007-0030696 A | 3/2007 |

(Continued)

OTHER PUBLICATIONS

Thomson Innovation Patent Record, DWPI Accession No. 2006-755161, English-Language Abstract of Korean Patent Publication No. 10-2007-030696 A, published Mar. 16, 2007; 5 pages.

*Primary Examiner* — Toan Ton
*Assistant Examiner* — Steven H Whitesell Gordon
(74) *Attorney, Agent, or Firm* — Sterne, Kessler, Goldstein & Fox P.L.L.C.

(57) ABSTRACT

A position measurement system to measure a position of a movable stage includes a reference plate; a plurality of sensors arranged such that, depending on a position of the movable stage relative to the reference plate, at least a subset of the plurality of sensors is configured to cooperate with the reference plate to provide for each of the sensors in the subset respective sensor signals representative of a position of the respective sensor relative to the reference plate; and a processor arranged to determine from the sensor signals a stage position, the processing device configured so as to, when the stage is in a position where an over-determined number of sensor signals is provided by at least the subset of the sensors that are in operational cooperation with the reference plate, (a) determine the stage position from a subset of the over-determined number of sensor signals, and (b) correct a sensor signal of one or more of the sensors from a discrepancy between the determined stage position and a remainder of the sensors signals.

16 Claims, 2 Drawing Sheets

U.S. PATENT DOCUMENTS

| | | | |
|---|---|---|---|
| 7,025,498 B2 * | 4/2006 | del Puerto | 374/44 |
| 7,065,737 B2 | 6/2006 | Phan et al. | |
| 7,483,120 B2 * | 1/2009 | Luttikhuis et al. | 355/53 |
| 7,602,489 B2 | 10/2009 | Van Der Pasch et al. | |
| 7,839,485 B2 | 11/2010 | Shibazaki | |
| 2006/0023178 A1 * | 2/2006 | Loopstra et al. | 355/53 |
| 2006/0139595 A1 * | 6/2006 | Koenen et al. | 355/55 |
| 2006/0227309 A1 * | 10/2006 | Loopstra et al. | 355/53 |
| 2007/0195296 A1 * | 8/2007 | Van Der Pasch et al. | 355/53 |
| 2007/0263191 A1 * | 11/2007 | Shibazaki | 355/53 |
| 2007/0288121 A1 * | 12/2007 | Shibazaki | 700/213 |
| 2008/0079920 A1 * | 4/2008 | Hommen et al. | 355/55 |
| 2008/0088843 A1 * | 4/2008 | Shibazaki | 356/399 |
| 2008/0218713 A1 * | 9/2008 | Shibazaki | 355/52 |

FOREIGN PATENT DOCUMENTS

| | | |
|---|---|---|
| TW | 200534362 A | 10/2005 |
| WO | WO 2007/083758 A1 | 7/2007 |

* cited by examiner

STAGE SYSTEM, LITHOGRAPHIC APPARATUS INCLUDING SUCH STAGE SYSTEM, AND CORRECTION METHOD

CROSS-REFERENCE TO RELATED APPLICATION

This application claims priority to U.S. Application 60/996,505 filed on Nov. 20, 2007. The subject matter of that application is incorporated herein by reference as if fully set forth herein.

BACKGROUND

1. Field of Invention

The invention relates to a stage system, a lithographic apparatus including such stage system, and to a correction method to correct a position measurement system in a dual stage area lithographic apparatus.

2. Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

To be able to measure a position of the substrate table (also referred to as substrate stage), a measurement system may be provided in the lithographic apparatus. Likewise, a position measurement system may be provided to measure a position of the mask table or patterning device support (also referred to as mask stage) which is arranged to hold the patterning device or mask. For such position measurement systems, use may be made of many measurement principles, such as interferometer(s) encoder(s) etc. In such measurement systems, use may be made of reference plates, such as encoder plates. Thereby, a sensor of the measurement system may be connected to the stage, thus moving with the stage and following the position of the stage, while the sensor being arranged to perform a measurement from which a position or displacement or distance information of the sensor relative to the reference plate, may be determined. In such solutions, a plurality of sensors may be provided on the stage, e.g. at various edges, sides etc. thereof. Depending on a position of the stage relative to the reference plate or reference plates, a subset of the sensors may be active, as in some of the positions one or more of the sensors may be outside a reach of the plate in question, or may be in an area between adjacent plates, etc. Therefore, depending on a position of the stage relative to the plates, different subsets of the sensors may be used to determine the position of the stage. Also, due to many causes of disturbance, a position measurement by the sensors may be inconsistent. As an example, a position of such sensor relative to the stage may be subject to a tolerance, temperature drift, etc., a position of one or more of the plates may be subject to drift or other disturbances, the plates themselves may be subject to fluctuations such as thermal expansion, etc.

By such disturbances, inconsistencies in readout of the sensors may occur. Due to such inconsistencies, several phenomena may be observed. As an example, assuming that a stage with 4 sensors is provided, while at a first position sensors 1-3 are applied to measure the position of the stage, while at a second position, sensors 1, 2 and 4 are applied thereto, while a drift of sensor 4 has occurred. Then, a position determination of the first position from sensors 1-3 may be inconsistent with a position determination from sensors 1, 2 and 4, causing a control system, such as a feedback control system to control a position of the stage, to correct the position of the stage based on the position determined from (a subset of) the sensors, hence causing the stage in the second position to be corrected by such feed back operation differently which may result in an offset, rotation, etc., in other words a mismatch of the stage position at the second position relative to the stage position at the first position. As a consequence thereof, offset errors, alignment errors, overlay errors etc., may occur.

SUMMARY

It is desirable to improve a stage position measurement accuracy of a stage.

According to an embodiment of the invention, there is provided a stage system including a movable stage, and a position measurement system to measure a position of the stage, the position measurement system including a reference plate, a plurality of sensors, wherein depending on a position of the stage relative to the reference plate at least a subset of the sensors is configured to cooperate with the reference plate to provide respective sensor signals of a position of the respective sensor relative to the reference plate, and a processor which is arranged to determine from the sensor signals a stage position, wherein in a position of the stage where an over-determined number of sensor signals is provided by at least the subset of the sensors being in operational cooperation with the reference plate, the processor is arranged to determine the stage position from a subset of the over-determined number of sensor signals, and to correct a sensor signal of one or more of the sensors from a discrepancy between the determined stage position and a remainder of the sensors signals.

According to a further embodiment of the invention, there is provided a lithographic apparatus including an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein one of the support and the substrate table includes such stage system.

According to a still further embodiment of the invention, there is provided a correction method to correct a position measurement system in a dual stage area lithographic apparatus having dual stage area's in which one or more stages are movable in an expose area and a measurement area, the position measurement system to measure a stage position in each of the stage area's, the correction method including positioning one of the stages in the measurement area; measuring, by the position measurement system, the position of the one of the stages to obtain a first position measurement; displacing the one of the stages by a first predetermined distance; measuring, by the position measurement system, the position of the one of the stages to obtain a second position measurement; positioning the one of the stages in the expose area; measuring, by the position measurement system, the position of the one of the stages to obtain a third position measurement; displacing the one of the stages by a second predetermined distance; measuring, by the position measurement system, the position of the one of the stages to obtain a fourth position measurement; determining a measurement area correction factor for the position measurement system from a difference between the first and second position measurement and the first predetermined distance; determining an expose area correction factor for the position measurement system from a difference between the third and fourth position measurement and the second predetermined distance; determining a measure to expose scaling factor from the measurement area correction factor and the expose area correction factor; and relating by the scaling factor the position measurement in the expose area to the position measurement in the measurement area.

In an embodiment of the invention, there is provided a stage system for use in a lithographic apparatus, the stage system including a movable stage configured to move over a reference plate; a plurality of sensors arranged on the movable stage such that, depending on a position of the movable stage relative to the reference plate, at least a subset of the sensors is configured to cooperate with the reference plate, each of the sensors in the subset providing sensor signals representative of a position of the sensor relative to the reference plate; and a processor configured to determine a position of the movable stage from the sensor signals in the subset, wherein when the stage is positioned relative to the reference plate such that the processor is able to calculate a position of the movable stage from part of the sensor signals, the calculator is configured to correct a sensor signal of at least one of the sensors based on the determined stage position and a remainder of the sensors signals.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
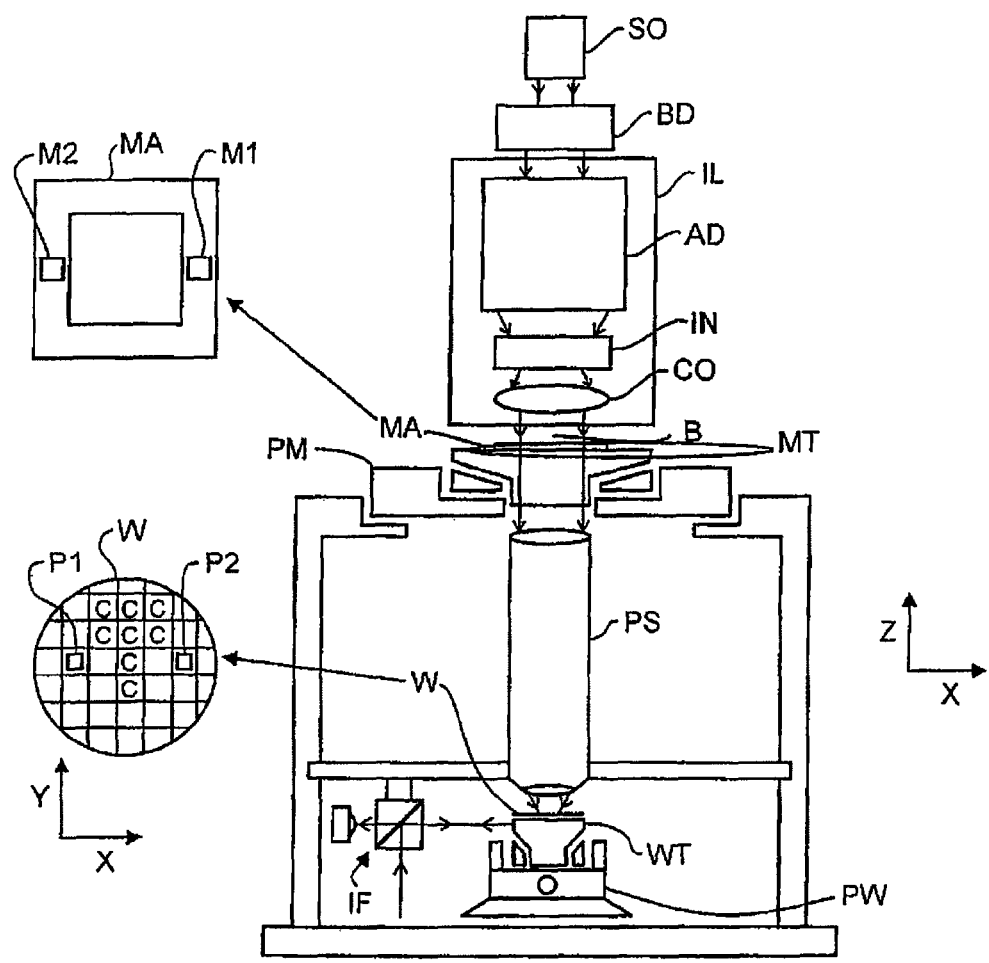
FIG. 1 depicts a lithographic apparatus as an example of an arrangement that includes an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure or patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or substrate support constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device support (e.g. mask table) MT or mask support and the substrate table WT or substrate support are kept essentially stationary, while an entire pattern imparted to the radiation beam is projected onto a target portion C at one time (i.e. a single static exposure). The substrate table WT or substrate support is then shifted in the X and/or Y direction so that a different target portion C can be exposed. In step mode, the maximum size of the exposure field limits the size of the target portion C imaged in a single static exposure.

2. In scan mode, the patterning device support (e.g. mask table) MT or mask support and the substrate table WT or substrate support are scanned synchronously while a pattern imparted to the radiation beam is projected onto a target portion C (i.e. a single dynamic exposure). The velocity and direction of the substrate table WT or substrate support relative to the patterning device support (e.g. mask table) MT or mask support may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g. mask table) MT or mask support is kept essentially stationary holding a programmable patterning device, and the substrate table WT or substrate support is moved or scanned while a pattern imparted to the radiation beam is projected onto a target portion C. In this mode, generally a pulsed radiation source is employed and the programmable patterning device is updated as required after each movement of the substrate table WT or substrate support or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figures 2A, 2B:
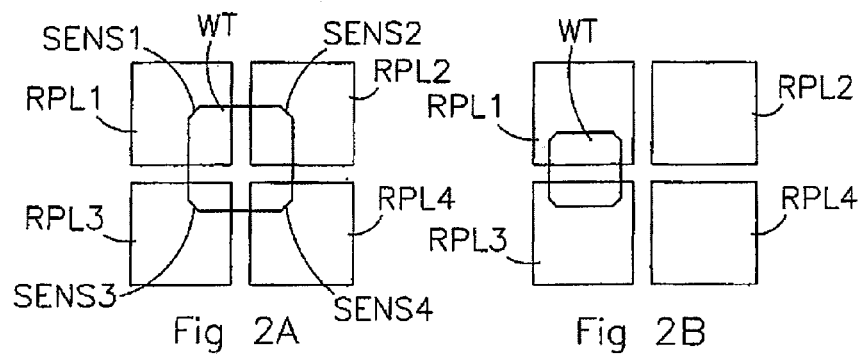
FIGS. 2a-2c each depict a highly schematic top view of a stage system according to an embodiment of the invention.

FIG. 2a shows a top view of a wafer stage WT which is positioned above (or under) a reference plate in this example including 4 reference plates: reference plate RPL 1—reference plate RPL 4. The wafer stage WT is provided with 4 sensors, each of which being located at a respective edge of the wafer stage WT. In the position of the wafer stage WT with respect to the reference plates RPL 1-RPL 4, sensor SENS 1 at a first edge of the wafer stage cooperates with reference plate RPL 1, sensor SENS 2 at a second edge of the wafer stage WT cooperates with reference plate RPL 2, sensor SENS 3 at a third edge of the wafer stage WT cooperates with reference plate RPL 3, and sensor SENS 4 at a fourth edge of the wafer stage WT cooperates with reference plate RPL 4. Thereby, each of the sensors provides a respective sensor signal representative of a position of the respective sensor relative to the respective one of the reference plates. The reference plates may be provided with a cut out towards a center of the assembly of the 4 reference plates, the cut out for making space for the projection system to project the patterned beam onto a target portion of the substrate.

The correction of the sensor signal(s) may be performed in many ways, e.g. by adding a correction value (such as in a form of an offset value), to the sensor signal that has been calibrated before.

In FIG. 2*b*, a different position of the wafer stage WT is shown, sensors SENS 1 and SENS 2 cooperate with the first reference plate RPL 1, while sensors SENS 3 and SENS 4 cooperate with the third reference plate RPL 3.

Figures 2C, 3:
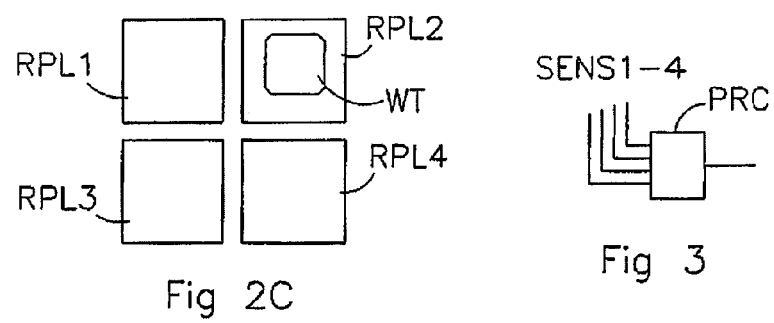
FIG. 3 highly schematically depicts a controller of a stage system in accordance with an embodiment of the invention.

Again a different position is shown in FIG. 2*c*, where all sensors SENS 1-SENS 4 cooperate with the second reference plate RPL 2.

Sensor signals of each of the sensors SENS 1-SENS 4 are provided to a processing device PRC, such as a micro processor, micro controller, dedicated analog or digital electronics, programmable integrated circuit device, or any other suitable processing device. The processing device may be broadly termed a "processor". The processing device or processor is arranged (e.g. programmed) to determine from the sensor signals, or a subset thereof, a stage position. In the example shown here, each of the sensors SENS 1-SENS 4 provides a 2 dimensional position signal, providing a position information in a vertical direction, i.e. a direction perpendicular to the plane of drawing of FIGS. 2*a*-2*c*, and a position information in an X-direction or an Y-direction. Sensors SENS 1 and SENS 4 may for example provide a position information in the vertical (Z) direction and in the X- direction, while sensors SENS 2 and SENS 3 provide a position information in the Y- direction and in the vertical (Z) direction. Consequently, in the positions shown in FIGS. 2*a*-2*c*, an over-determined number of sensor signals is provided, as a position in 6 degrees of freedom only requires 6 suitable chosen sensor signals from e.g. 3 of the sensors, i.e. a sub set of the sensors SENS 1-SENS 4.

Figures 4A, 4B:
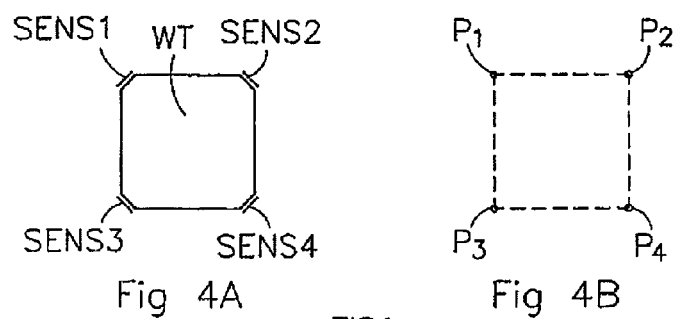
FIGS. 4a and 4b highly schematically depict a top view of a stage respectively position measurements by sensors of the stage.

An example of such position determination will be described with reference to FIGS. 4*a* and 4*b*. In FIG. 4*a*, a top view of a wafer stage WT is shown, similar or identical to that shown in FIGS. 2*a*-2*c*. As symbolically indicated in FIG. 4*b*, the position of the stage WT is in this example determined from position signals P1, P2 and P3 (each e.g. including a 2 dimensional position signal) of respective sensors SENS 1, SENS 2 and SENS 3. According to an aspect of the invention, the position signal P4 of the fourth position sensor SENS 4 is now applied to correct one or more of the sensor signals. In case that a discrepancy occurs between the position signals, the position signals may, in their relation with respect to each other, not match an expected interrelation given by their respective positions with respect to the wafer stage WT. Such discrepancy or inconsistency may be accounted for by correcting one or more of the sensor signals to be able to get a consistent position in readout, irrespective of the sub set of position signals applied to determine the position. The correction may be formed by an adding of a respective offset correction to one or more of the sensor signals. In case that for example the processor is arranged to correct sensor signal P4, i.e. the remaining sensor signal not forming part of the sub set, from the discrepancy, consistency between the sensor signals is obtained again.

In an other embodiment, in the situation where the position of the stage is determined from the sensor signals P1, P2 and P3, while sensor signal P4 provides a readout inconsistent with the sensor signals P1, P2 and P3, instead of correcting the sensor SENS 4, i.e. the remaining sensor, it is also possible to correct the subset of the sensors which is applied to determine the position therefrom (in this situation being the sensors SENS 1-SENS 3). By accounting the discrepancy to a plurality of the sensors, the correction is more likely to coincide with the physical sensor drift that lead to the discrepancy, as it is more likely that discrepancy has been caused by drift of a plurality of the sensors, than by drift of a single one (the one to which the discrepancy is assigned) of the sensors. Alternatively, according to the aspect of the invention described here, an inconsistency in positions signals provided by the position sensors is solved by assigning such inconsistency to a single one of the sensors only, and providing a correction in such way that consistency is provided again.

The processing device or processor may be arranged to correct one or more of the sensors from the discrepancy (i.e. inconsistency) by making use of geometric model of the stage. The geometric model may provide for a relation between the sensors as desired, e.g. a nominal position relation between the sensors. The geometric model may be stored in a memory, such as an electronic memory. By correcting one or more of the sensor signals, the expected relation between the position signals as provided by the sensors may be restored, i.e. brought into conformity with the expected relation between the position signals according to the geometric model. Thereby, consistency may be obtained by a relatively easy to implement algorithm.

In a further embodiment, the processing device or processor may be arranged to determine their correction at least two times. Each time, the substrate table may be at a different position relative to the reference plates. Thereby, the processing device or processor may be arranged to determine an expansion, e.g. a thermal expansion of the reference plates (or other grating plate deformation) from a difference between the determined corrections at the different positions. In other words, when e.g. at a location of the wafer stage in or near a sensor of the reference plate, a correction has been performed leading to a consistent readout of the sensors, while the more the wafer stage is moved to an edge of the reference plate, the larger inconsistency is found, such position dependent inconsistency may be translated into an expansion error of the reference plate.

The above embodiments may not only be applied to a wafer stage, however may also be implemented in any other stage, such as the patterning device support (e.g. mask stage or reticle stage) of the lithographic apparatus.

Figure 5:
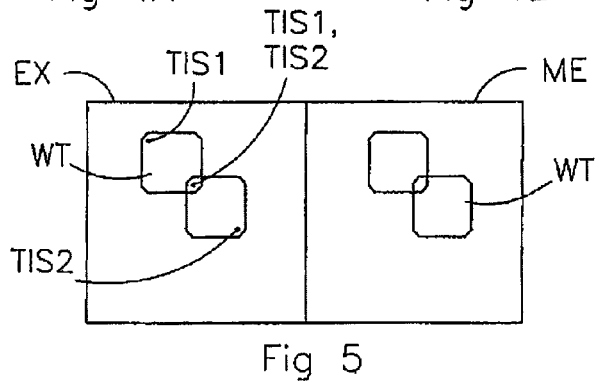
FIG. 5 depicts a highly schematic top view of a dual stage system.

A further aspect of the invention will now be described with reference to FIG. 5. FIG. 5 shows a highly schematic top view of a dual stage system of e.g. a dual stage lithographic apparatus having a measurement area ME and an exposure area EX. Stages WT 1 and WT 2 are movable in the measurement area and in the expose area. The measurement as well as the exposure area are each provided with a reference plate RPL, or a plurality of reference plates, such as the 4 reference plates schematically indicated in FIGS. 2*a*-2*c*. According to the correction method, a position of one of the stages (WT1) is measured by the position sensors SENS 1-SENS 4, or a sub set thereof. The stage is than displaced by a pre-determined distance. Again, the position is measured by the position sensors SENS 1-SENS 4. The same procedure is repeated at the exposure side where again a position measurement is performed, the stage is displaced by a pre-determined distance which may or may not be the same as the pre-determined distance at the measurement side, and the position is measured again. At the measurement side, a measurement area correction factor may now be determined from the difference between the two position measurements and the measurement side, and the pre-determined distance in with the stage was displaced between these measurements, and an exposure area correction factor may be determined similarly from the two measurements at the exposure area and the predetermined distance with which the stage has been displaced between these measurements at the expose side. A measure to expose scaling factor may be now be derived from the correction factors at the measurement and expose side. The correction factor may be applied to relate the position measurement in the exposure area to the position measurement in the measurement area, to thereby obtain a consistent position measurement in both areas, in other word to prevent an inconsistency when the stage travels from the exposure area to the measurement area or visa versa.

The pre-determined distance may be provided by making use of existing position sensors: at the exposure side, use may be made of the transmission image sensors of the stage (an optical sensor to allow alignment related measurements). As a position relation between the two transmission image sensors or TIS sensors of the stage is known, a pre-determined distance for displacement of the stage may be obtained by positioning the stage with the first respectively, the second TIS sensor at the exposure side.

At the measurement side, use may be made of alignment marks of the stage. As a geometric relation between the alignment marks may be known, a displacement over a predetermined distance may be obtained by first position the stage using a first one of the alignment marks, and than positioning the stage using a second one of the alignment marks.

The correction emitted described with reference to FIG. 5 may be applied in combination with a measurement system as described with reference to FIGS. 2-4 having a plurality of reference plates and sensors connected to the stages, however the correction method may also be applied in combination with any other suitable positioning system.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A stage system comprising:
   a movable stage; and
   a position measurement system configured to measure a position of the movable stage, the position measurement system comprising:
   a reference plate;
   a plurality of sensors configured to cooperate with the reference plate to provide an over-determined number of respective sensor signals representative of a position of the respective sensor relative to the reference plate; and
   a processor configured to:
   determine a stage position from a subset of the over-determined number of sensor signals, and
   use any one or more of the over-determined number of sensor signals to correct a sensor signal of any one or more remaining over-determined number of sensor signals from a discrepancy between the determined stage position and a remainder of the over-determined number of sensor signals.

2. The stage system according to claim 1, wherein the processor is configured to correct each sensor signal of the remainder of the plurality of sensors from the discrepancy.

3. The stage system according to claim 1, wherein the processor is configured to correct one or more of the plurality of sensors from the discrepancy by determining a relation between the determined stage position and the remainder of the sensor signals using a geometric model of the movable stage, the geometric model stored in a memory, and by deriving the correction from the relation.

4. The stage system according to claim 1, wherein the reference plate comprises adjacently positioned reference plates.

5. The stage system according to claim 4, wherein the reference plate comprises 4 adjacently positioned reference plates.

6. The stage system according to claim 1, wherein the plurality of sensors comprises 4 sensors.

7. The stage system according to claim 1, wherein the processor is configured to determine the correction at least twice, wherein each time the movable stage is at a different position relative to the reference plate, the processor is configured to determine an estimate of an expansion of the reference plates from a difference between the determined corrections at the different positions.

8. The stage system according to claim 1, wherein the movable stage is a substrate stage of a lithographic apparatus.

9. The stage system according to claim 1, wherein the movable stage is a patterning device stage of a lithographic apparatus.

10. A lithographic apparatus comprising:
an illumination system configured to condition a radiation beam;
a patterning device support constructed to support a patterning device, the patterning device being capable of imparting the radiation beam with a pattern in its cross-section to form a patterned radiation beam;
a substrate support constructed to hold a substrate; and
a projection system configured to project the patterned radiation beam onto a target portion of the substrate, wherein
one of the supports comprises a stage system including:
a movable stage; and
a position measurement system configured to measure a position of the movable stage, the position measurement system comprising:
a reference plate;
a plurality of sensors configured to cooperate with the reference plate to provide an over-determined number of respective sensor signals representative of a position of the respective sensor relative to the reference plate; and
a processor configured to:
determine a stage position from a subset of the over-determined number of sensor signals, and
use anyone or more of the over-determined number of sensors signals to correct a sensor signal of any one or more remaining over-determined number of sensor signals from a discrepancy between the determined stage position and a remainder of the over-determined number of sensor signals.

11. A stage system for use in a lithographic apparatus, the stage system comprising:
a movable stage configured to move over a reference plate;
a plurality of sensors arranged on the movable stage and configured to cooperate with the reference plate, each of the sensors from the plurality of sensors providing sensor signals representative of a position of the sensor relative to the reference plate; and
a processor configured to determine a position of the movable stage from the sensor signals,
wherein when the stage is positioned relative to the reference plate such that the processor is able to calculate a position of the movable stage from a subset of the sensor signals, the processor is configured to use any one or more of the sensor signals to correct any one or more remaining sensor signals based on the determined stage position and a remainder of the sensors signals, and
wherein the processor is configured to correct the any one or more remaining sensor signals by deriving the correction from a determined relation between the determined stage position and the remainder of the sensor signals using a geometric model of the movable stage.

12. The stage system according to claim 11, wherein the reference plate comprises adjacently positioned reference plates.

13. The stage system according to claim 12, wherein the reference plate comprises 4 adjacently positioned reference plates.

14. The stage system according to claim 11, wherein the plurality of sensors comprises 4 sensors.

15. The stage system according to claim 11, wherein the movable stage is a substrate stage of the lithographic apparatus.

16. The stage system according to claim 11, wherein the movable stage is a patterning device stage of the lithographic apparatus.

* * * * *